(12) United States Patent
Choo

(10) Patent No.: US 7,151,655 B2
(45) Date of Patent: Dec. 19, 2006

(54) ELECTROSTATIC DISCHARGE (ESD) DETECTOR

(75) Inventor: Wei Chien Choo, Bayan Lepas (MY)

(73) Assignee: Intel Corporation, Santa Clara, CA (US)

(*) Notice: Subject to any disclaimer, the term of this patent is extended or adjusted under 35 U.S.C. 154(b) by 245 days.

(21) Appl. No.: 10/847,092

(22) Filed: May 17, 2004

(65) Prior Publication Data

US 2005/0254192 A1    Nov. 17, 2005

(51) Int. Cl.
*H02H 9/00* (2006.01)

(52) U.S. Cl. .............. 361/56; 361/777; 361/780; 361/783; 361/794; 257/691; 257/786; 324/452

(58) Field of Classification Search ........... 361/56, 361/777, 780, 783; 257/691, 786; 324/452
See application file for complete search history.

(56) References Cited

U.S. PATENT DOCUMENTS

| 6,249,410 | B1 | 6/2001 | Ker et al. |
| 6,522,511 | B1 | 2/2003 | John et al. |
| 6,566,715 | B1 | 5/2003 | Ker et al. |
| 6,621,673 | B1 | 9/2003 | Lin et al. |
| 6,690,067 | B1 | 2/2004 | Ker et al. |
| 2005/0258842 | A1* | 11/2005 | Maloney ............ 324/750 |

* cited by examiner

*Primary Examiner*—Brian Sircus
*Assistant Examiner*—Terrence Willoughby
(74) *Attorney, Agent, or Firm*—Schwabe, Williamson & Wyatt, P.C.

(57) ABSTRACT

An electrostatic discharge (ESD) detector and a system having an ESD detector have been described herein.

25 Claims, 3 Drawing Sheets

ELECTROSTATIC DISCHARGE (ESD) DETECTOR

TECHNICAL FIELD & BACKGROUND

The present disclosure relates generally to microelectronics. More specifically, but not exclusively, the present disclosure is related to the detection of electrostatic discharge (ESD) events occurring in integrated circuits and during the processing of integrated circuits.

ESD events are a well-known problem in the microelectronics industry. An ESD event may damage an integrated circuit when static charge rapidly discharges through an integrated circuit. Left undetected, this may lead to integrated circuits being shipped out of factories either totally inoperable or with latent defects. Continuous scaling of microelectronics is likely to worsen the problem as integrated circuit element sizes become smaller and thus more susceptible to damage from ESD events. Typical ESD detectors used in factories may include electromagnetic antennas that are normally positioned either by hand or ad-hoc mechanically supported about 3–6 inches away from a "target" or discharge region. The use of such antennas, however, can be impractical for various reasons. For example, peak-to-peak voltages detected on such antennas may have limited frequency spectrums.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, an electrostatic discharge (ESD) detector and a system having an ESD detector.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding embodiments of the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

For simplicity and clarity of explanation, various embodiments of the invention are shown in the figures according to various views. It is to be appreciated that such views are merely illustrative and are not necessarily drawn to scale or to the exact shape. Furthermore, it is to be appreciated that the actual devices utilizing principles of the invention may vary in shape, size, configuration, contour, and the like, other than what is shown in the figures.

Figure 1:
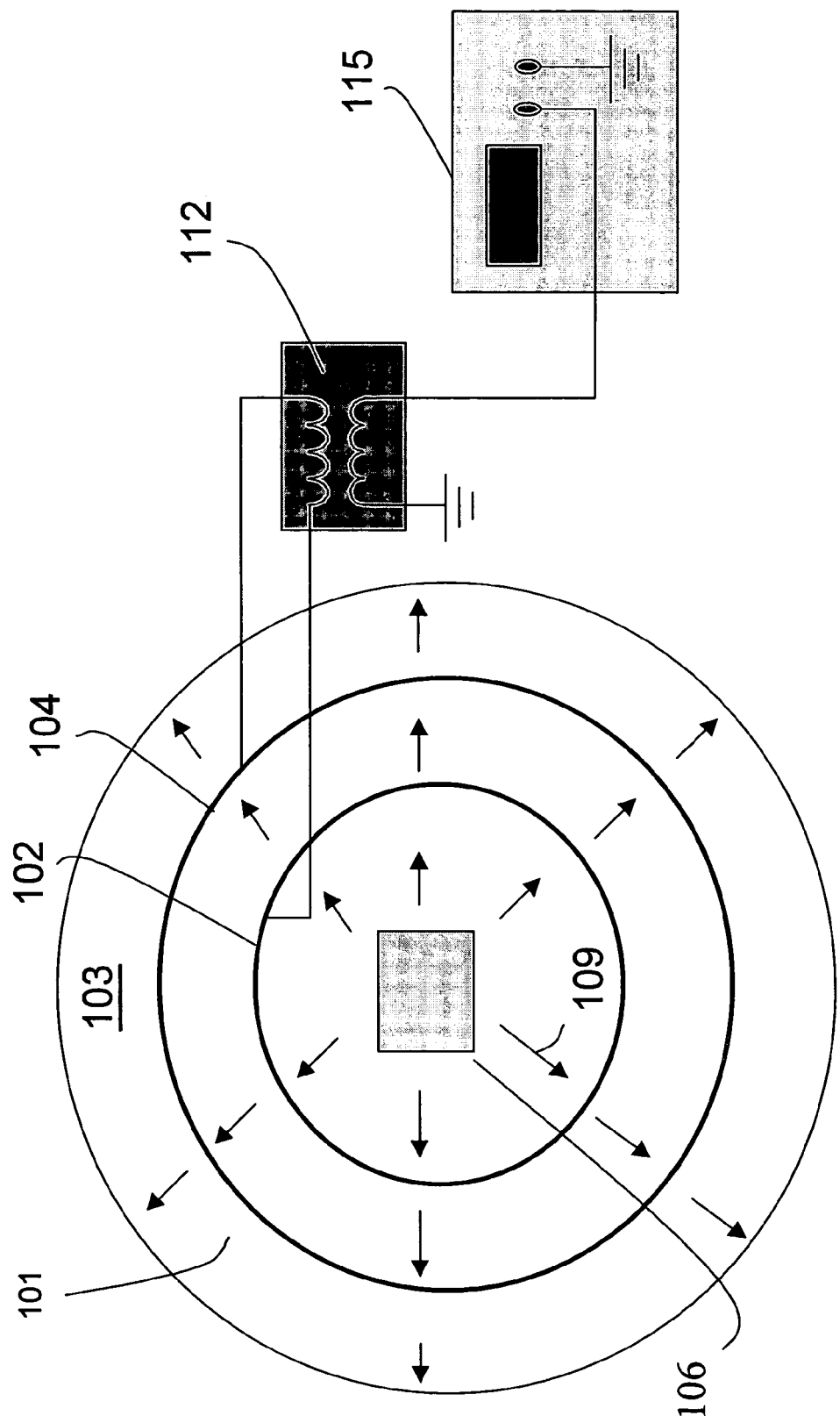
FIG. 1 illustrates an electrostatic discharge (ESD) detector in accordance with one embodiment.

Referring now to FIG. 1, wherein a diagram illustrating an electrostatic discharge (ESD) detector in accordance with one embodiment is shown. As illustrated, for the embodiment, detector 101 may include a socket 106 located substantially on a ground plane. In the embodiment, at least one or more pins of socket 106 may be located on the ground plane. For the embodiment, socket 106 may be adapted to receive an integrated circuit in a test package. As illustrated, a first conductive ring 102 on the ground plane may surround socket 106 so that socket 106 is disposed at a center or substantially near the center of first ring 102. Detector 101 also includes a second conductive ring 104, concentric to first ring 102 and disposed on the ground plane, according to the embodiment. Note that in other embodiments, socket 106 may be adapted to be any suitable type of contact, such as for example, a contact to receive an integrated circuit on a wafer. In one embodiment, the contact may comprise one or more sort probes.

For the embodiment, detector 101 including socket 106 may be a part of or include a test hardware device such as a test interface unit (TIU) 103 to receive an integrated circuit. In one embodiment, TIU 103 may provide an interface between a tester or automated test equipment ("ATE") (not shown) and an integrated circuit. The ATE may be used to test an integrated circuit by transmitting and analyzing electrical signals to and from the integrated circuit to verify the performance of the integrated circuit. Note that for the embodiment, first and second rings 102 and 104 may be part of TIU 103 in a form of first and second substantially concentric traces on an upper surface of a printed circuit board (PCB). In the embodiment, first and second rings 102 and 104 are directly connected to ground. Also note, that in other embodiments, the test hardware device may comprise the ATE itself or other suitable tester adapted to receive the integrated circuit.

For the illustrated embodiment, first ring 102 detects an electronic signal 109 emanating from socket 106. Electronic signal 109 may be indicative of an ESD event occurring during a socketing process, such as when an integrated circuit is coupled to an ATE through TIU 103. As electronic signal 109 emanates outward, second ring 104, substantially concentric to first ring 102, may then detect electronic signal 109. As illustrated in the embodiment, an electronic device 112 may be coupled to first and second rings 102 and 104 to generate a signal indicative of an ESD event. In one embodiment, electronic device 112 may comprise a balun to receive and then balance first and second signals outputted by first and second rings 102 and 104 to generate a third signal. Furthermore, as illustrated, an automated detector 115 may be coupled to first and second rings 102 and 104 through electronic device 112 to present the third signal for examination to determine whether an ESD event has occurred. Note that in an alternate embodiment, electronic device 112 may be located on TIU 103.

Figure 2:
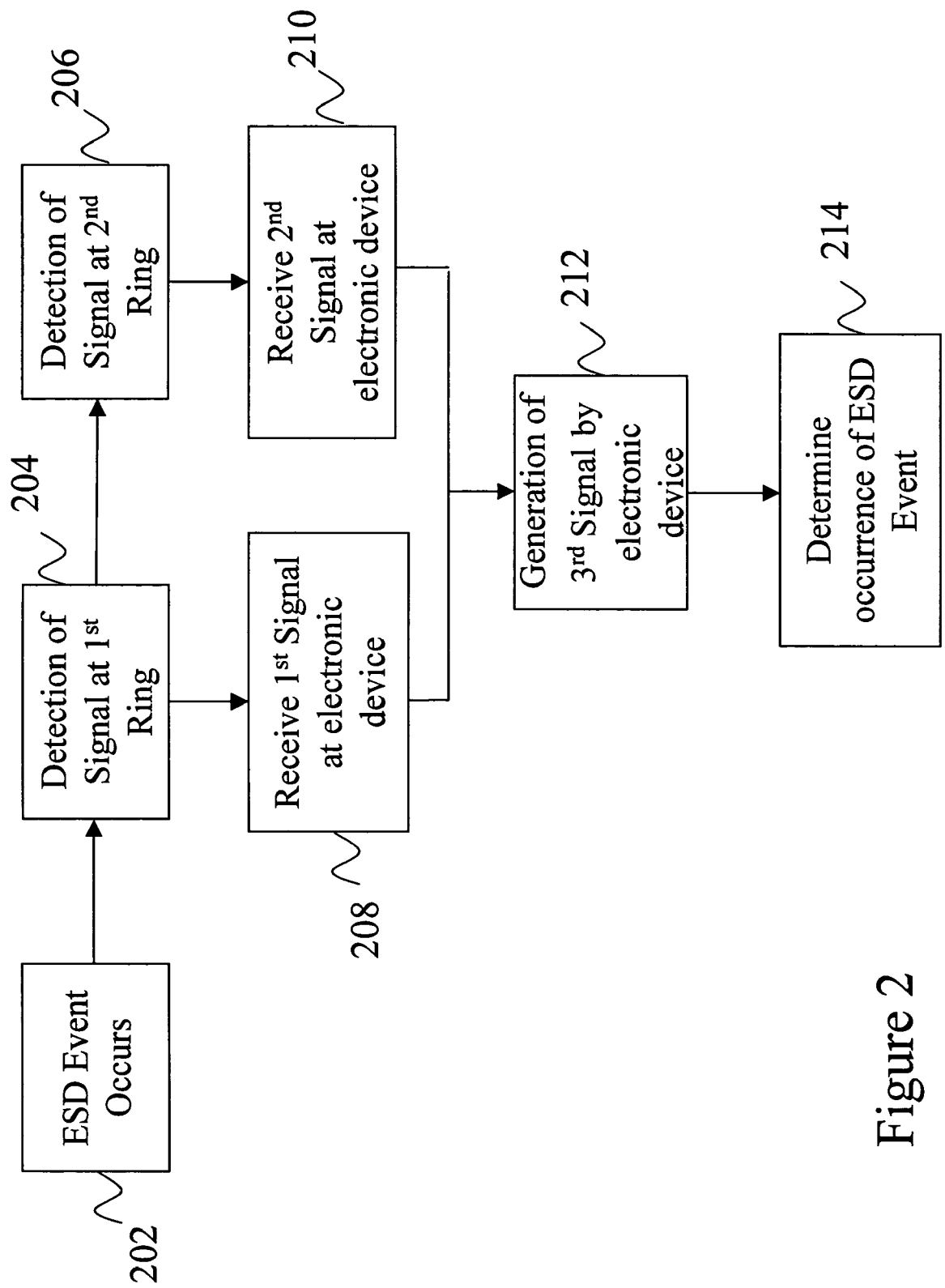
FIG. 2 is a flow diagram illustrating an example sequence of events associated with one embodiment.

FIG. 2 is a flow chart illustrating an example sequence of events associated with an embodiment similar to that described above. Beginning at a block 202, an ESD event occurs. In the embodiment, the ESD event may occur when an integrated circuit is coupled to an ATE or other tester through TIU 103 at centrally located socket 106 (see FIG. 1). At a block 204, for the embodiment, electronic signal 109 may be detected at first ring 102. Next, at a block 206, as electronic signal 109 continues to emanate outwards, electronic signal 109 may be detected at second ring 104.

At blocks 208 and 210, electronic device 112 may then receive, respectively, first and second signals outputted by first and second rings 102 and 104 that are responsive to emanating electronic signal 109. Note that for the embodiment, electronic device 112 may have a transformer with terminals respectively coupled to first and second rings 102 and 104. At a next block 212, electronic device 112 may generate a third signal based at least in part on the first and second signals.

Occurrence of the ESD event may be determined at a final block 214. The signal generated by electronic detector 112 (referred to as the "third signal" above) may be examined to determine if an ESD event has occurred at the contact. To enhance the third signal, automated detector 115 may be coupled to receive and then present the third signal for examination. In various embodiments, automated detector 115 may be an ESD event monitor or oscilloscope. As an example, an ESD event occurring at socket 106 may display characteristics observed on an oscilloscope such as a dampening sinusoidal and peak-to-peak voltage. Note that because in the embodiment signal 109 is detected on the ground plane, frequencies disposed at a low end of a frequency spectrum as well as frequencies disposed at a high end of a frequency spectrum may be included in a frequency behavior of the third signal to be examined for determination of whether the ESD event has occurred.

Figure 3:
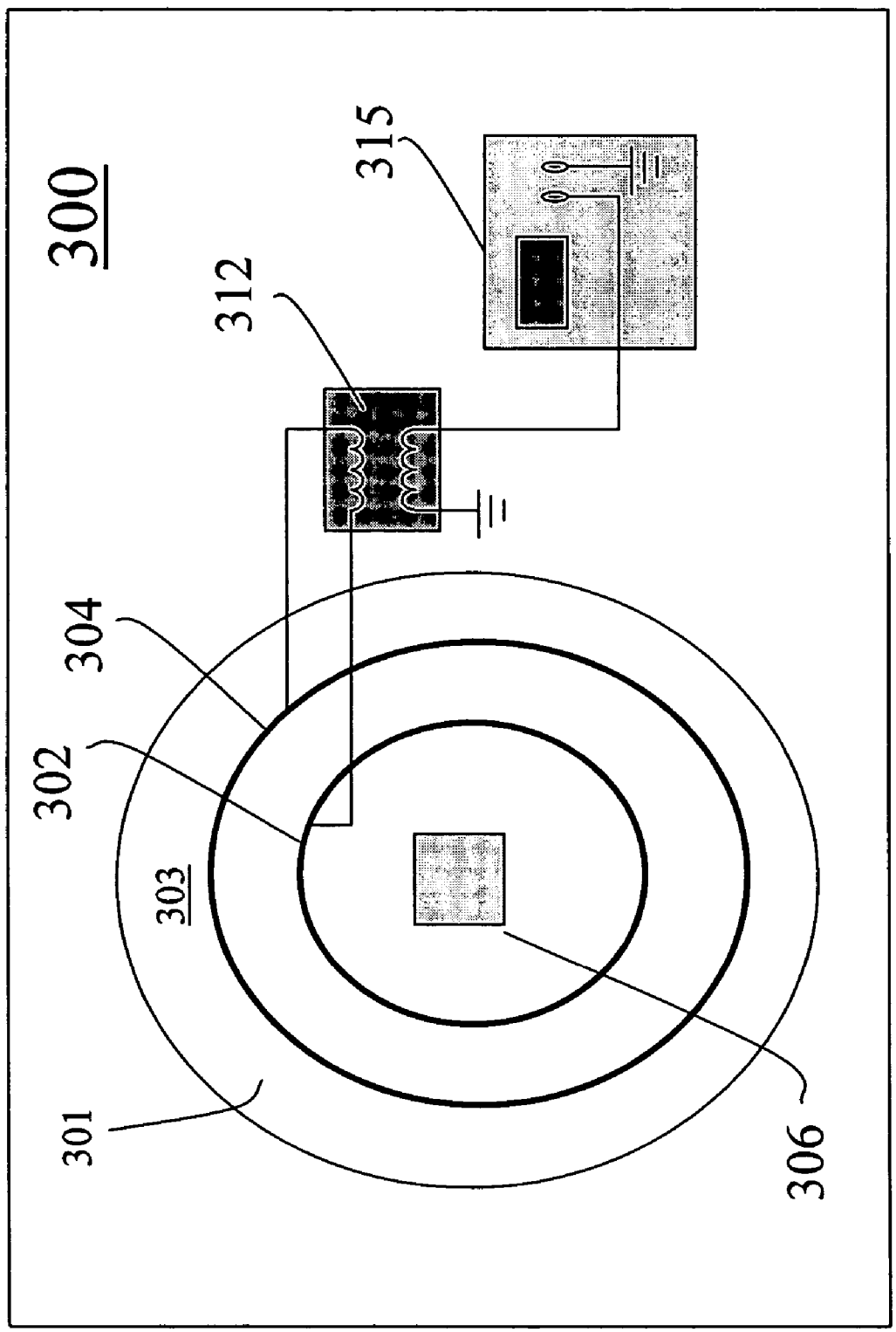
FIG. 3 illustrates a system having an ESD detector in accordance with one embodiment.

FIG. 3 illustrates an example system 300, in accordance with one embodiment. As illustrated for the embodiment, system 300 includes a TIU 303 having a detector 301 including a ground plane, a socket 306 and first and second conductive rings 302 and 304 surrounding socket 306 in a concentric manner. In the embodiment, first and second rings 302 and 304 have been adapted to detect an electronic signal emanating from socket 306. An automated detector or oscilloscope 315 may be coupled to first and second rings 302 and 304 through an electronic device, in this embodiment, a balun 312. Thus, oscilloscope 315 may receive first and second signals outputted by the first and second rings 302 and 304 to present a signal indicative of the occurrence of an ESD event based at least in part on the received first and second signals. Note that in alternate embodiments of system 300, detector 301 may be included directly in an ATE or other suitable tester without TIU 303 and that oscilloscope 315 may comprise a monitor or sensor integrated into such a tester.

Thus, it can be seen from the above descriptions, a novel ESD detector and a system having such a detector have been described. While the present invention has been described in terms of the foregoing embodiments, those skilled in the art will recognize that the invention is not limited to the embodiments described. The present invention can be practiced with modification and alteration within the spirit and scope of the appended claims.

Thus, the description is to be regarded as illustrative instead of restrictive on the present invention.

What is claimed is:

1. An apparatus, comprising:
   a ground plane;
   a socket located substantially on the ground plane;
   a first ring disposed on the ground plane, and surrounding the socket, with the socket disposed substantially at its center, to detect an electrostatic discharge event; and
   a second ring disposed on the ground plane, concentric to the first ring, to detect the electrostatic discharge event.

2. The apparatus of claim 1, further comprising an electronic device coupled to the first and second rings to generate a signal indicative of the electrostatic discharge event.

3. The apparatus of claim 2, wherein the electronic device comprises a balun device having a transformer with terminals respectively coupled to the first and second rings.

4. The apparatus of claim 1, wherein the apparatus further comprises a test hardware device, of which, the socket is a part.

5. The apparatus of claim 4, wherein the test hardware device includes a test interface unit to receive an integrated circuit.

6. The apparatus of claim 1 wherein the apparatus further comprises a test interface unit, and the first and second substantially concentric rings are part of the test interface unit in the form of first and second substantially concentric traces.

7. The apparatus of claim 1 wherein the socket is adapted to receive an integrated circuit on a wafer or a test package.

8. A method, comprising:
   coupling an electronic device to first and second conductive rings disposed on a ground plane, surrounding a contact, the first and second rings having been adapted to detect an electronic signal emanating from the contact;
   receiving by the electronic device, first and second signals outputted by the first and second rings responsive to the emanating electronic signal; and
   generating by the electronic device, a third signal based at least in part on the first and second signals.

9. The method of claim 8 wherein the method further comprises examining by the electronic device, the third signal to determine if an electrostatic discharge event has occurred at the contact.

10. The method of claim 9 wherein the examining includes presenting the third signal on an automated detector.

11. The method of claim 10 wherein the presenting on the automated detector comprises presenting on an oscilloscope.

12. The method of claim 10 wherein the examining includes examining at least a selected one of a first and second frequency behavior of the third signal, the first frequency being disposed at a low end of a frequency spectrum, and the second frequency being disposed at a high end of a frequency spectrum.

13. The method of claim 8 wherein the generating includes using a balun to balance the received first and second signals.

14. The method of claim 13 wherein the balun is located on a test interface unit, and the receiving comprises receiving the first and second signals through the balun.

15. The method of claim 14 wherein the method further comprises coupling an integrated circuit to an automated test equipment through the test interface unit.

16. The method of claim 14 wherein the contact is included substantially in a center of a test interface unit, and the method further comprises coupling the integrated circuit to the contact.

17. The method of claim 8 wherein the first and second conductive rings are traces within a test interface unit, and the coupling comprises coupling the electronic device to the traces.

18. The method of claim 8 wherein the contact comprises one or more sort probes and the method further comprises coupling an integrated circuit to the one or more sort probes.

19. A system, comprising:
a test interface unit having a ground plane, a socket and first and second conductive rings substantially disposed on the ground plane, with the first and second rings surrounding the socket in a concentric manner; and
an automated detector coupled to the first and second rings of the test interface unit to receive first and second signals outputted by the first and second rings responsive to an electrostatic discharge event on the ground plane, and to present a signal indicative of the occurrence of the electrostatic discharge event based at least in part on the received first and second signals.

20. The system of claim 19 wherein the test interface unit includes a balun device, and the automated detector is coupled to the first and second rings through the balun device.

21. The system of claim 19 wherein the automated detector comprises an oscilloscope.

22. The system of claim 19 wherein the automated detector is adapted to examine the first and second signals for a first and a second frequency behavior, where the first and second frequencies are disposed at a low end and a high end of a frequency spectrum respectively.

23. The system of claim 19 wherein the socket is located substantially in a center of the first and second rings.

24. The system of claim 19 wherein the test interface unit provides an interface between an automated test equipment device and an integrated circuit.

25. The system of claim 19 wherein the automated detector comprises an electrostatic discharge event monitor.

* * * * *